United States Patent
Hossack

(10) Patent No.: US 6,819,276 B1
(45) Date of Patent: Nov. 16, 2004

(54) NOISE-SHAPER SYSTEM AND METHOD

(75) Inventor: David MacDonald Hossack, Cambridge, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/438,590

(22) Filed: May 13, 2003

(51) Int. Cl.[7] .............................................. H03M 3/00
(52) U.S. Cl. ..................................... 341/143; 341/144
(58) Field of Search ................................ 341/144, 143, 341/141

(56) References Cited

U.S. PATENT DOCUMENTS

| | | | |
|---|---|---|---|
| 5,376,936 A | 12/1994 | Kerth | 341/150 |
| 5,404,142 A | 4/1995 | Adams et al. | 341/144 |
| 6,124,814 A | 9/2000 | Lee et al. | 341/143 |
| 6,348,884 B1 * | 2/2002 | Steensgaard-Madsen | 341/118 |
| 6,509,791 B2 | 1/2003 | Segawa et al. | 327/554 |
| 6,614,377 B1 * | 9/2003 | Adams et al. | 341/144 |

* cited by examiner

*Primary Examiner*—Peguy JeanPierre
(74) *Attorney, Agent, or Firm*—Koppel, Jacobs, Patrick & Heybl

(57) ABSTRACT

A noise-shaper system includes a scrambler coupled to receive the output of a randomizer. The randomizer has an input for receiving a plurality of parallel equally weighted bits in a first sequence, and a first output which provides said bits in a pseudorandom sequence with a transformation that is not dependant on said first sequence. The scrambler is coupled to receive the randomizer's output and, in response, to produce a second non-pseudorandom sequence of the bits at a second output with a transformation that is dependent on the pseudorandom sequence. The resultant output is noise shaped to reduce distortion.

19 Claims, 7 Drawing Sheets

| M1 (input) | 0 | 0 | 0 | 1 | 1 | 1 | 1 | 1 |
|---|---|---|---|---|---|---|---|---|
| M4 (output) | 1 | 1 | 1 | 1 | 0 | 0 | 0 | 1 |

FIG. 6B

NOISE-SHAPER SYSTEM AND METHOD

BACKGROUND OF THE INVENTION

1. Field of the Invention

This invention relates to electronic systems, and more particularly to digital-to-analog conversion.

2. Description of the Related Art

Digital-to-analog converters (DACs) used in audio applications produce analog signals from digital data while minimizing audible distortion produced in the conversion. A typical audio DAC system consists of an interpolation filter, a multi-level sigma-delta modulator ("SDM"), and a multi-bit DAC to turn the multi-bit digital signal into an analog voltage. Unfortunately, non-matched analog components in the system tend to cause linearity errors in the analog output. The multi-bit DAC can be implemented with a thermometer decoder and multiple 1-bit DACs. First, the thermometer decoder converts a quantized word output from the SDM into a thermometer code. For an N-bit input, $2^N-1$ or more equally-weighted elements are used for the output. The number of output bits set to a value of one is equal to the value of the input quantized word. The individual 1-bit outputs from the thermometer decoder are then communicated to respective 1-bit DACs and summed to produce an analog output. This method results in distortion because of a correlation between a particular range of input values and bit paths through the thermometer decoder and 1-bit DACs to the system output.

More recently, sigma-delta DAC systems have used dynamic mapping to change the bit paths within the system in a manner which reduces the effects of component mismatch. Typically, a scrambler is added between the thermometer decoder and 1-bit DACs. The scrambler has an array of swapper cells that switch their data paths in response to data presented to the scrambler itself. Analog mismatch errors are reduced within the band of interest by switching the cells to avoid repeated bit values from cycle to cycle at each swapper-cell output. One such scrambler for thermometer-code digital signals is described by R. Adams et al., in U.S. Pat. No. 5,404,142. In this patent, a number of swapper cells are interconnected in a "butterfly" arrangement. Each has inputs for a control signal to determine whether its inputs are connected directly or "swapped" to its outputs. The control signal for each cell is developed by logic circuitry which responds to the states of the cell input signal bits and the state of a difference signal developed as the integrated difference of prior swapper output signals. The transformation of data paths is dependant on the state of the cell input signal bits and its prior state. This has the effect of shifting the noise created by mismatched components in the system to higher frequencies. Unfortunately, the scrambler is limited in the number of switching paths available for a given input. Consequently, even though the scrambler uses an input-dependent switching algorithm to maintain a "busy" output, mismatched components can still cause linearity distortion in the band of interest when the scrambler is presented repeating or slowly changing input samples.

FIG. 1 illustrates a DAC system utilizing a scrambler 130 to minimize the linearity problem with multi-bit noise-shapers. In a typical application, a 16–24 bit pulse-code modulated (PCM) input signal is introduced to an interpolation filter 100 to remove out of band images and increase the sample rate for use by a sigma-delta modulator 110. The sigma-delta modulator 110 can quantize the signal to 3 bits for introduction to a thermometer decoder 120. The thermometer decoder 120 converts the 3 bit word into a plurality of equally weighted 1-bit signals at its parallel output to allow subsequent dynamic mapping. In thermometer decoding, a digital word representing a low number activates fewer 1-bit signals from the decoder. Similarly, a larger number is converted with more 1-bit signals. For example, for a 3-bit input, eight equally weighted elements in the thermometer decoder 120 are used to represent the full range of possible quantized input levels. Each element of the thermometer decoder's output is individually coupled to individual inputs of a scrambler 130. The input bit to output-bit dynamic mapping must ensure that each input bit is switched to only one output bit to rearrange the sequence, rather than the number, of parallel sample inputs. The DACs are coupled in turn to a summing node 150 which may then be coupled to an analog filter (not shown) for additional filtering.

Switching for the scrambler 130 is provided by a number generator 160 such as that shown in FIG. 2 (prior art). In FIG. 2, the number generator 160 is implemented as a pseudorandom random number generator having sixteen registers (1–16). A 5-bit signal is cascaded into three EXOR gates (G1, G2, G3) created from tapping registers 16, 5; 3 and 2, respectively. The first, second and third shift registers are tapped to provide output signals to the scrambler 130 at outputs S0, S1, and S2, respectively. During each clock cycle, the S0, S1, and S2 terminals provide collectively a 3-bit control word to the scrambler 130 to enable a signal-independent change in sequence between the input signal and output signal. The control signal from the random number generator 160 allows each swapper cell to be switched equally as often when averaged over a long period of time. The effect of mismatch is to introduce noise over a wide bandwidth, including the band of interest.

Unfortunately, in sigma-delta based DACs that employ either signal-dependent or signal-independent scramblers between the thermometer decoder 120 and 1-bit DACs, simulations show in-band noise behavior that is undesirable in some audio applications. There still exists a need, then, for a sigma-delta DAC that reduces signal dependent in-band noise.

SUMMARY OF THE INVENTION

A noise shaper system is described, in one embodiment, for use with DACs. An input of parallel equally-weighted bits is provided to a randomizer in a first sequence, which randomizes the order of the bits into a second sequence at its output without regard for the first sequence. A scrambler receives the output of the randomizer, and re-orders the bits into a third sequence with a transformation that depends on the second sequence.

More particularly, one embodiment is described by converting a multi-bit input signal into a plurality of equally-weighted bits proportional to the input signal that are in a first sequence, re-ordering the bits into a second sequence with a first transformation that is not dependent on said first sequence, and re-ordering said bits in said second sequence into a third sequence with a second transformation that is dependent on the second sequence.

Through the re-ordering of the bits through the randomizer and scrambler, the bits are noise shaped to reduce noise distortion.

BRIEF DESCRIPTION OF THE DRAWINGS

The components in the figures are not necessarily to scale, emphasis instead being placed upon illustrating the princi

FIG. 5a is a block diagram showing a swapper cell of the scrambler illustrated in FIG. 4.

FIG. 5b is a logic table describing the states of the swapper cell illustrated in FIG. 5a.

FIG. 6b is a table showing one sample rotation of data presented to the barrel rotator illustrated in FIG. 6a.

DETAILED DESCRIPTION OF THE INVENTION

A noise shaper system is described for use with DACs. A multi-bit decoder, preferably a thermometer decoder in a first stage, converts a multi-bit input signal into a plurality of equally weighted single bits, the number of which is proportional to the received multi-bit signal value. The bits are provided to a second stage which randomizes the order of the bits into a second sequence at its output without regard for the first sequence at its input. A third stage receives the output of the first, and re-orders the bits into a third sequence with a transformation that depends on the second sequence. Through the ordering of the bits through the first, second and third stages, DAC mismatching errors are reduced in the frequency band of interest.

Figure 1:
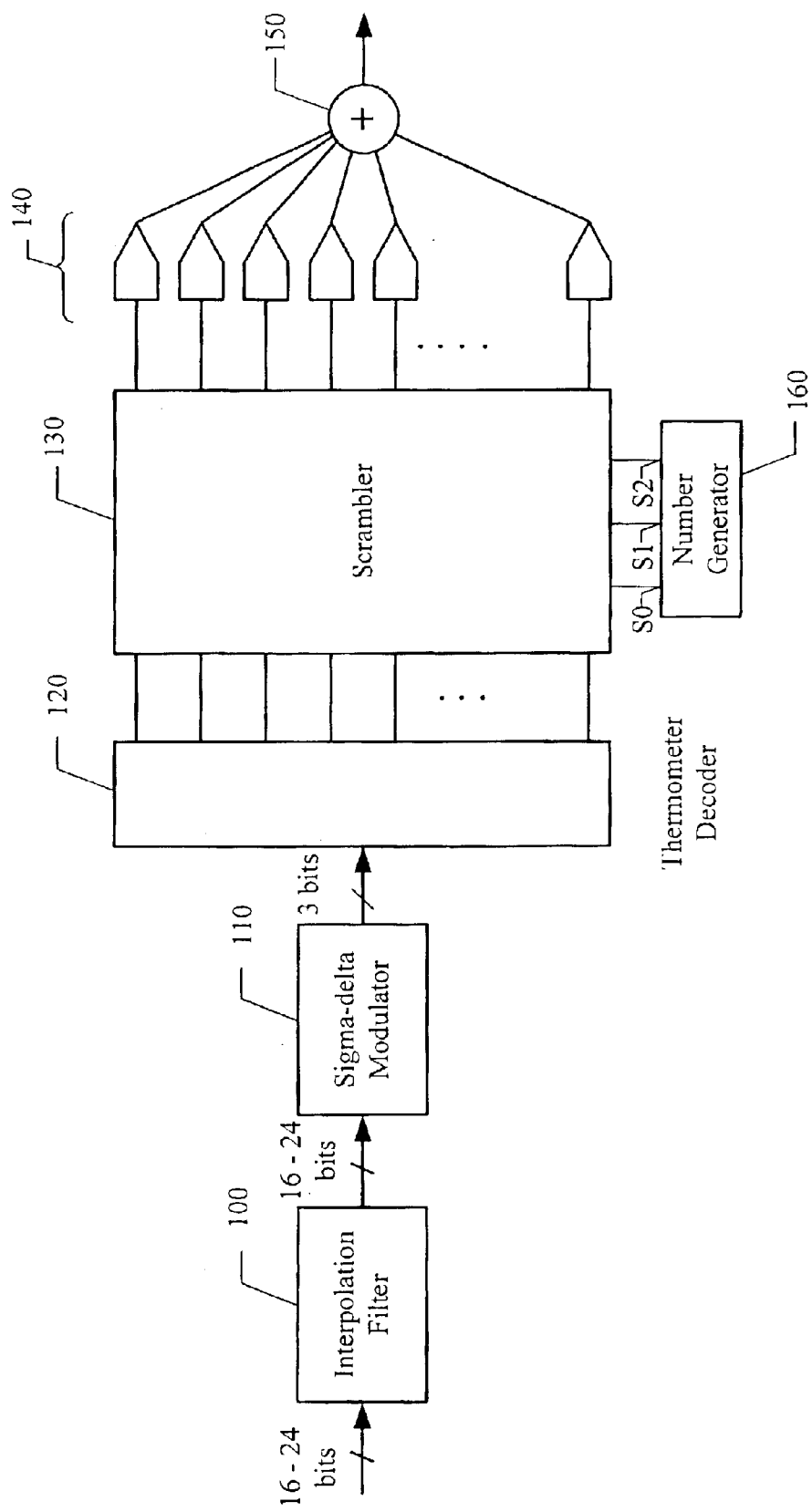
- FIG. 1 is a block diagram of a prior art sigma-delta based DAC having a thermometer decoder and scrambler.
Figure 3:
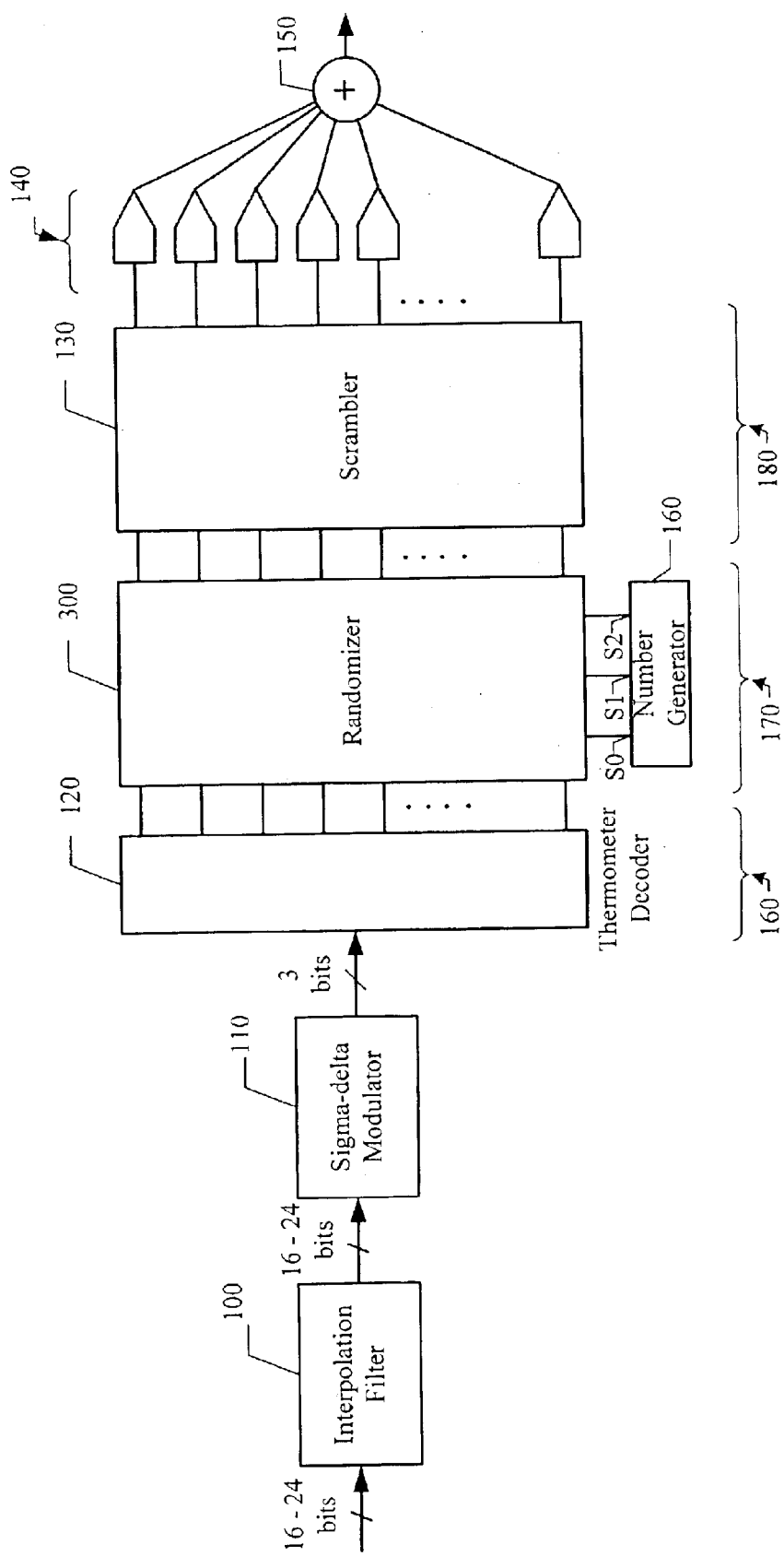
FIG. 3 is a block diagram of, in one embodiment, a sigma-delta based DAC, having a randomizer between the thermometer decoder and the scrambler.

FIG. 3 illustrates, in one embodiment, a scrambler-based DAC having a randomizer 300 coupled between a thermometer decoder 120 and a scrambler 130. Similar to the prior art sigma-delta DAC illustrated in FIG. 1, a 16–24 bit PCM signal is provided to an interpolation filter 100 which transforms the sample into a higher sample rate, typically 64–256 times higher than the original sample rate. The sample is presented to the sigma-delta modulator 110 to be quantized to 3 bits for presentation to a thermometer decoder 120. Although the sample is illustrated having a certain number of bits, the number of bits described is for illustrative purposes only, and may be varied to suit different applications. For example, a DAC designed for a compact-disc (CD) player would receive a 16-bit word at 44.1 kHz at the interpolation filter 100 for conversion to a higher frequency at 2 bits by the sigma-delta modulator 110 for presentation to the thermometer decoder 120.

The input sample is converted by either the thermometer decoder 120 to a thermometer code, or by an alternative decoder that also outputs equally weighted bits, preferably with the number of "active-high" output bits representative of the amplitude of the multi-bit input sample. Each 1-bit output is presented to corresponding inputs of a randomizer 300 prior to presentation to the scrambler 130. In a thermometer code, since the 1-bit outputs are equally weighted, it is only the number of "1" bits during a clock period that indicate the quantized PCM level. The randomizer 300 receives the plurality of equally-weighted input bits and outputs the same number of 1-bit signals to the scrambler 130, but in a different parallel sequence that is either random or pseudorandom when compared to the sequence of its input. Consequently, the randomizer 300 may be implemented as either a scrambler or a barrel rotator, each controlled by a pseudorandom or random number generator 160 coupled to it, providing random logic words during each clock cycle, such as the pseudorandom number generator illustrated in FIG. 1. The output of the randomizer is coupled to the scrambler which provides a logic-driven dynamic mapping of input bits to output bits to reduce repeated bit values at each respective output path.

The structure and operation of the scrambler 130 is as described by R. Adams in U.S. Pat. No. 5,404,142, and such is incorporated by reference herein. Each of the respective outputs of the scrambler is coupled to individual 1-bit DACs 140 that provide their analog output to the summing node 150. The system is conceptualized, therefore, as having three stages prior to the 1-bit DACs, with a thermometer code stage 160, a signal-independent randomizing stage 170 and a signal-dependant scrambling stage 180.

Figure 2:
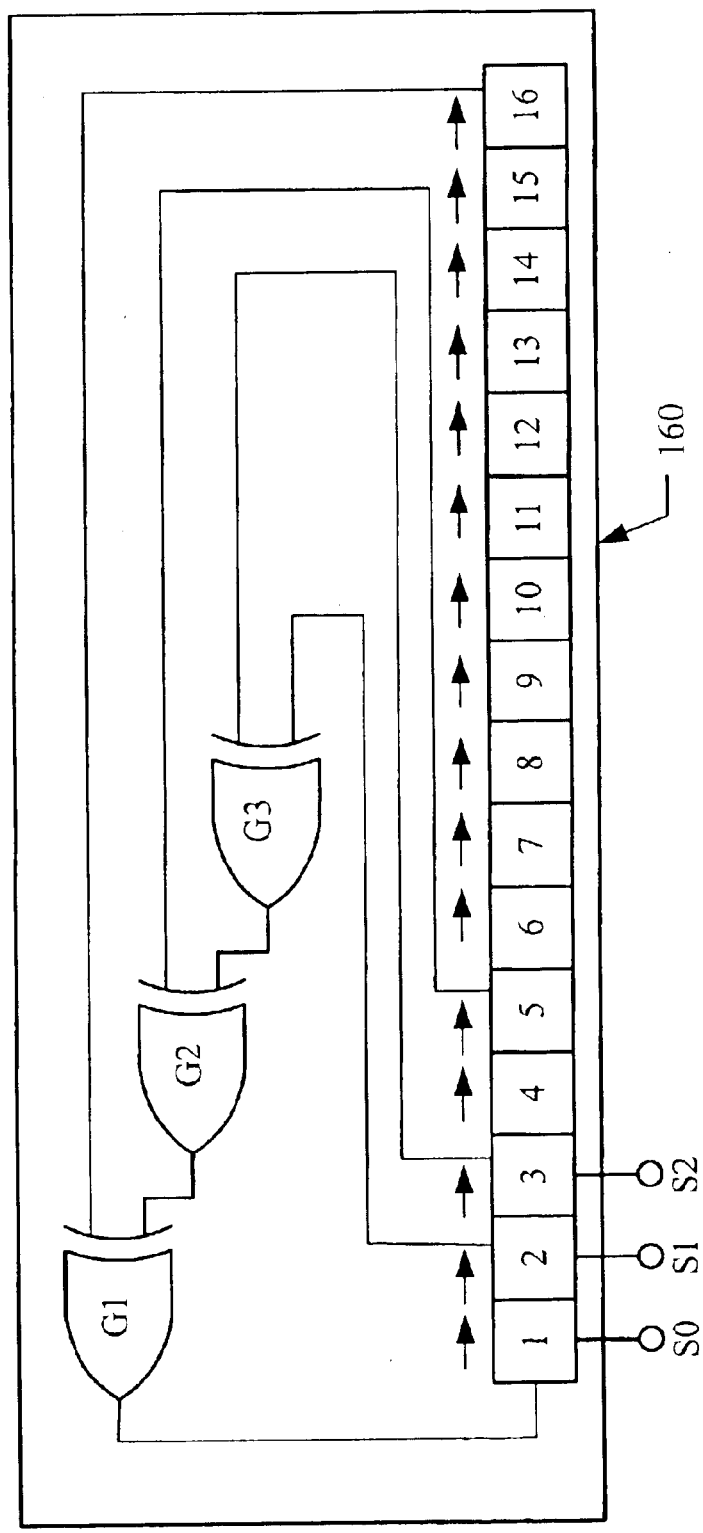
FIG. 2 is a schematic of a prior art pseudorandom number generator for use in the system of FIG. 1.
Figure 4:
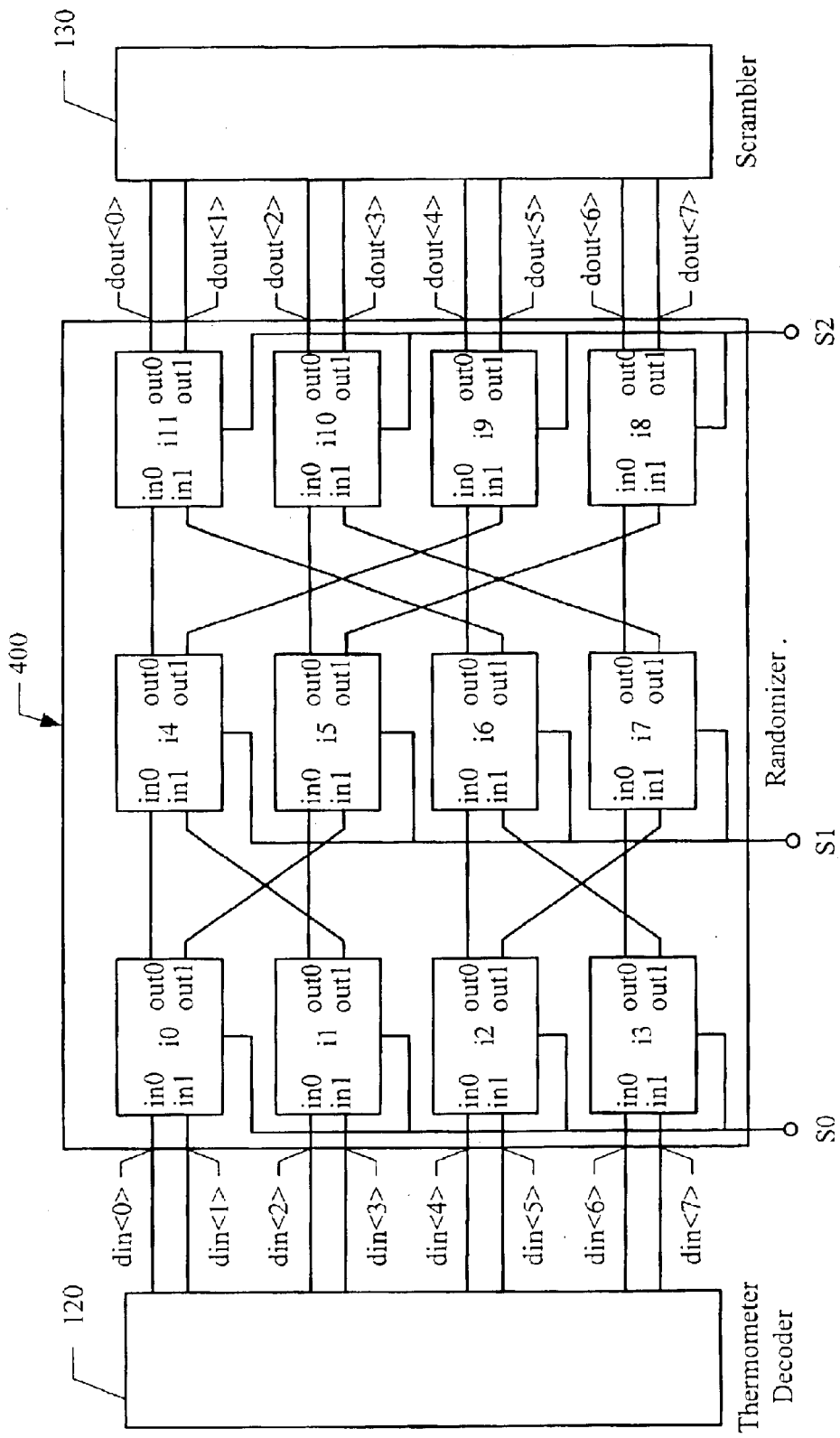
FIG. 4 is a block diagram of, in one embodiment, an array of swapper cells for use in the randomizer.

FIG. 4 illustrates, in one embodiment, an array of swapper cells used to implement the randomizer illustrated in FIG. 3. The array has a "butterfly" architecture, with each of a plurality of swapper cells (i0–i11) having two input terminals (in0, in1) and two output terminals (out0, out1). In a randomizer designed for use with a thermometer decoder 120 having eight 1-bit outputs (3-bit input), three columns of four swapper cells each are provided, for a total of twelve swapper cells (i0–i11). Each of the swapper cells in the first column (i0, have a control input terminal S0, with each swapper cell in the second column (i4–i7) having a control input terminal S1, and each swapper cell in the third column (i8–i11) having a control input terminal S2. The control input terminals correspond to the S0, S1, and S2 terminals of the pseudorandom number generator 160 in FIG. 2 so that the inputs at din<0>–din<7> are remapped to corresponding dout<0>–dout<7> outputs. Each swapper cell is activated to "swap" or "no swap" the sequence of input bits when providing output bits based on a "high" or "low" indication, respectively, received on its control input terminal. The architecture does not allow for all possible combinations of input to output mappings, but every input line can connect to every output line which in turn is coupled to individual inputs of a scrambler 130. The architecture also ensures that for any logic signal received at S0, S1, and S2 no two input samples are mapped to the same output path. For example, if the randomizer 300 receives a-3 bit control signal "011" at S0, S1, and S2, respectively, and din<0> and din<1> receive a "0" and "1," respectively, dout<3> and dout<4> would indicate "1" and "0," respectively. More particularly, the i0 swapper cell responds to a "0" bit (low) at its S0 terminal with a "no swap" to couple the din<0> and din<1> terminals to the in0 terminal of i4 and the in1 terminal of i5, respectively, resulting in "0" at the in0 terminal of the i4 swapper cell and "0" at the in1 terminal of is swapper cell, respectively. In response to the i4 and i5 swapper cells receiving a "1" at each of their S1 terminals, the cells "swap," to couple their respective in1 terminals to their out0 terminals, and their in0 terminals to their out1 terminals. The "0" indication at the in0 input of i4 is switched to the out1 terminal resulting a "0" at the in1 terminal of i9. The swap in i5 results in the "1" at in1 swapping to out0 to be coupled to the in0 terminal of The i9 and i10 swapper cells respond to the "1" (high) at their S3 terminals with a "swap" condition. The "1" at the in0 terminal of i10 is communicated to out1 which is coupled to dout<3>. The "0" at the in1 terminal of i9 is communicated to the out0 terminal which is coupled to dout<4>. The pseudo-randomization of the input to output paths between clock cycles reduces patterns in the output caused by patterns in the input that, in the presence of mismatch of the analog components, gives rise to tones and other non-random noise.

Figures 5A, 5B:
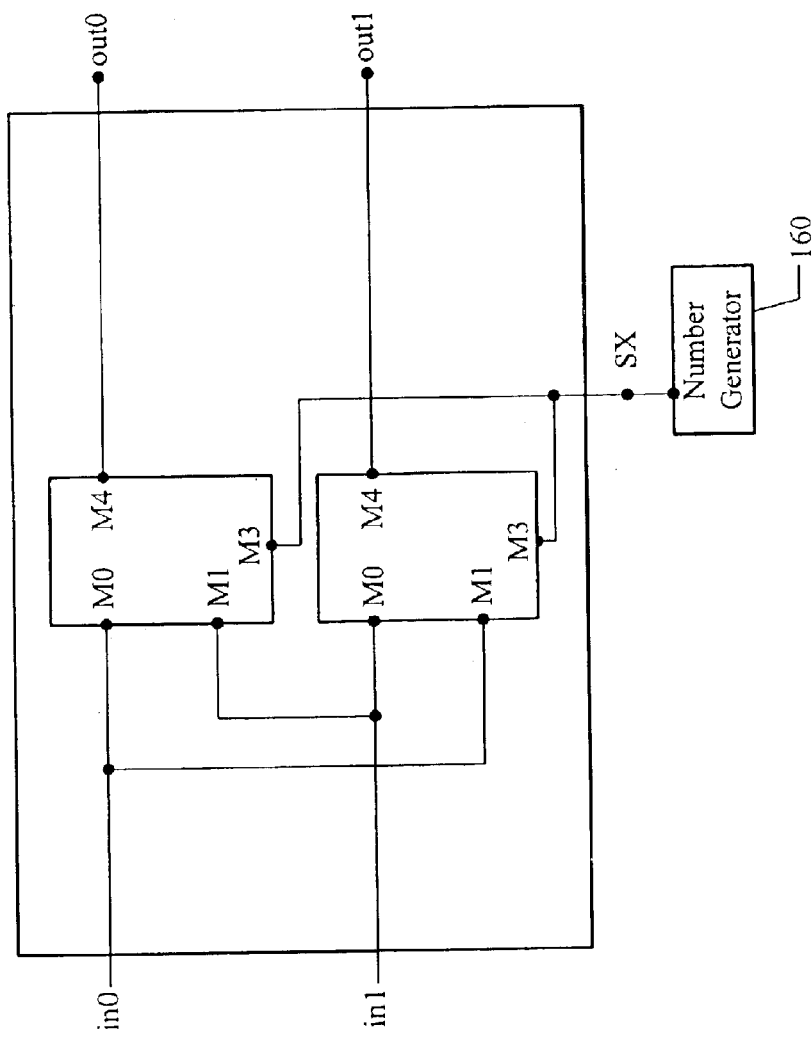

FIG. 5A is a block diagram illustrating, in one embodiment, a swapper cell for use in the array of swapper cells of the randomizer 300 illustrated in FIG. 4. The cell's upper input terminal (in0) is coupled to the upper input terminal (M0) of a first multiplexer ("MUX1") and to the lower input terminal M1 of a second multiplexer ("MUX2"). The cell's lower input terminal (in1) is coupled to the lower input terminal M1 and upper input terminal M0 terminals of MUX1 and MUX2, respectively. Both in0 and in1 receive either a "1" (high) or "0" (low) during operation as data for switching. A control input terminal SX is coupled to both MUX1 and MUX2 at their respective M3 terminals to control switching of each, and represents either S0, S1, or S2 of the pseudorandom number generator 160 depending on its placement in the randomizer 300. For example, if the swapper cell 500 is configured in the left column as one of either swapper cells i0, i1, i2, or i3, the control input terminal SX would be coupled to S0 (as illustrated in FIG. 4). MUX1 is coupled on its output side to the cell's upper output terminal (OUT0), and MUX2 is coupled on its output side to the cell's lower output terminal (OUT1), through each of their respective output terminals M4. During operation, a "1" (high) presented to the control input terminal sx results in a "swap" condition to couple the in0 to OUT1 and in1 to OUT0. In this manner, one of the S0, S1 or S3 outputs of the pseudo random number generator 200 provide the control signal for the swapper cell 500.

FIG. 5b illustrates a truth table for the swapper cell 500 illustrated in FIG. 5a. In the table, the first two columns represent possible input signals at in0 and in1, respectively. The third column represents the signal received at terminal SX from either S0, S1, or S2, and the last two columns are the signals at OUT0 and OUT1, respectively. For example, if the swapper cell receives a "1" at SX, data received at in0 and in1 would be "swapped" at OUT0 and in1. A "0" presented at in0 with a "1" at in1 would result in a "1" at the OUT0 and a "0" at OUT1. Similarly, if the swapper cell receives a "0" at SX, the data would not "swap" between the inputs (in0, in1) and the outputs (OUT0, OUT1). A plurality of such individual swapper cells 500 are interconnected as shown in FIG. 4 to form the randomizer illustrated in FIG. 3.

Figure 6A:
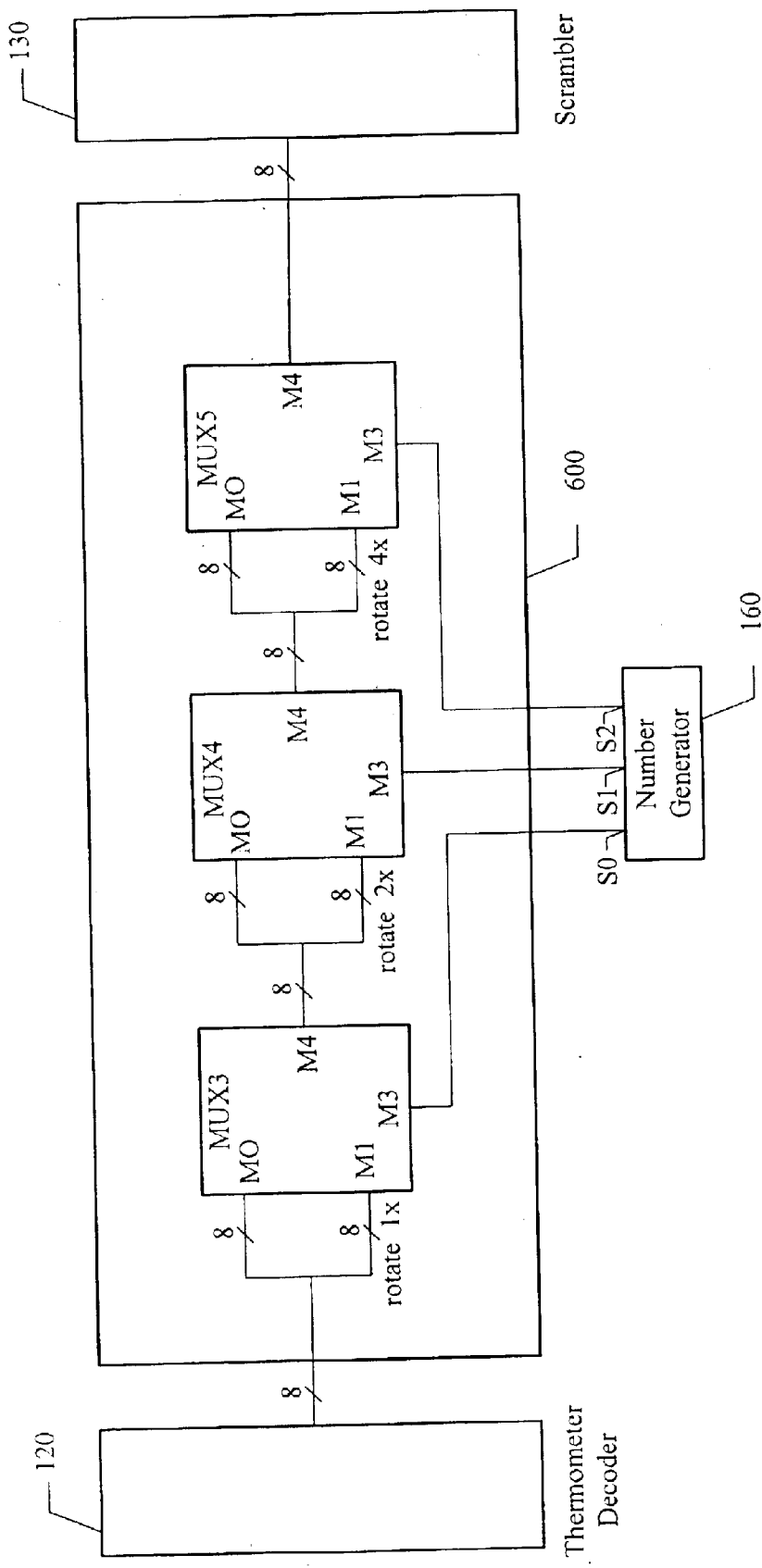
FIG. 6a is a block diagram of, in one embodiment, a barrel rotator for use as the randomizer illustrated in FIG. 3.

FIG. 6a illustrates, in one embodiment, a barrel rotator 600 for use as a randomizer 300. The three multiplexers of the rotator 600, MUX3, MUX4, and MUX5, are shown in communication with the S0, S1 and S2 output terminals, respectively, through each of their respective input control terminals M3. The rotator 600 is configured to receive an input signal comprising eight parallel 1 bit samples on its input side and to output eight parallel 1-bit samples on its output side. Each input signal is coupled to both M0 and M1 terminals of MUX3. MUX3, coupled to S0 is configured to rotate the sequence of the input signal received at its M1 input by 1. Consequently, for a "1" (high) control bit received at its input control terminal M3, MUX3 rotates the eight 1 bit samples by one and couples the rotated input signal to its output terminal M4 which is coupled to the input terminals M0 and M1 of MUX4. If a "0" is received at input control terminal M3, MUX3 couples the non-rotated input sample at terminal M0 to its output terminal M4 for communication to MUX4.

MUX4, coupled to S1 is configured to rotate the sequence of the input signal received at its M1 input by 2. Consequently, for a "1" (high) control bit received at its input control terminal M3, MUX4 rotates the eight 1 bit input samples from MUX3 by two bits and couples the rotated input to its output terminal M4 which is coupled to the input terminals M0 and M1 of MUX5. If a "0" is received at terminal M3, MUX4 couples the non-rotated input put signal at terminal M0 to its output terminal M4 for communication to MUX5.

MUX5 is configured to rotate the input signal received at its M1 input by four if a "1" (high) control bit is received at its input control terminal M3. The rotated input signal is output from its M4 output terminal. If a "0" is received at its M3 terminal, MUX4 does not rotate the input sample.

For example, if S0, S1 and S2 indicate 0, 1 and 1, respectively, the eight parallel 1-bit input samples received at MUX3 would be coupled to both S0 and S1 of MUX4 without rotation. Because MUX4 received a "1" at its input control terminal M3, it would rotate the bits by two and couple the resulting sequence to the inputs M0 and M1 of MUX5. The "1" received at terminal M3 of MUX5 results in MUX5 rotating the sequence by four bit positions resulting in a total rotation of six between the input and output of the barrel rotator 600 for the "011" input control signal from the driver 300.

Figure 6B:
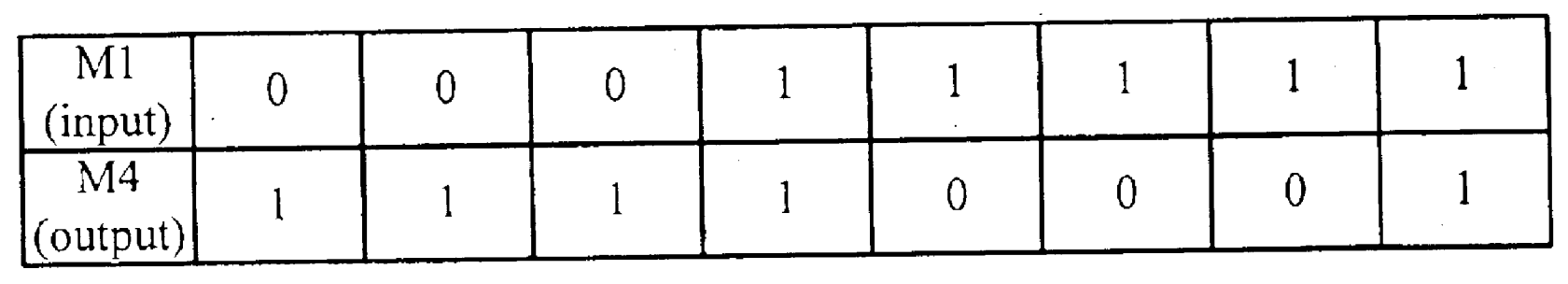

FIG. 6B is a table showing an example of a rotation for an input signal presented to the barrel rotator illustrated in FIG. 6a. The first row illustrates a sample input of eight bits representing equally weighted elements of a thermometer code received from the thermometer decoder 120. The input signal has a sequence of 0, 0, 0, 1, 1, 1, 1 and after rotation, has the sequence 1, 1, 1, 1, 0, 0, 0, 1. A "1" received at the M3 terminal of MUX5 would accomplish a barrel rotation of four enabling the presentation of the new sequence of equally-weighted elements to the scrambler 130.

The combination of a randomizer 300 in front of a scrambler 130 to change the sequence of the input signal makes the error due to component mismatch more noise-like and less dependent on the input signal when compared to the limited number of input to output signal paths available in traditional scrambler techniques. While various embodiments of the invention have been described, it will be apparent to those ordinary skill in the art that many more embodiments and implementations are possible within the scope of this invention.

I claim:

1. A noise-shaper system, comprising:
   a randomizer having an input for receiving a plurality of parallel equally-weighted bits in a first sequence, and a first output which provides said bits in a pseudorandom sequence with a transformation that is not dependant on said first sequence; and
   a scrambler coupled to receive said randomizer's output and in response to produce a second non-pseudorandom sequence of said bits at a second output with a transformation that is dependant on said pseudorandom sequence;
   wherein said bits are noise shaped at said second output to reduce distortion.

2. The system of claim 1, further comprising:
   a decoder coupled to said input to convert a multi-bit input signal to said bits for communication to said randomizer.

3. The system of claim 2, wherein said decoder further comprises a thermometer decoder.

4. The system of claim 1, further comprising:
   a number generator coupled to said randomizer to provide said randomizer with a control signal to rearrange said first sequence to said pseudorandom sequence.

5. The system of claim 4, wherein said number generator is a pseudorandom number generator.

6. The system of claim 4, wherein said randomizer is a scrambler.

7. The system of claim 6, wherein said scrambler further comprises:
a plurality of swapper cells interconnected in a "butterfly" arrangement, each having two cell inputs and two cell outputs.

8. The system of claim 7, wherein each of said swapper cells has a control input to control whether or not to swap its input to output signal paths.

9. The system of claim 1, wherein said randomizer is a barrel rotator.

10. The system of claim 9, wherein said barrel rotator has non-equally weighted control inputs, such that for N rotator control inputs said rotator has N-multiplexers to rotate incoming input signals by zero through $2^N-1$ rotations.

11. A noise shaping method, comprising:
converting a multi-bit input signal into a plurality of equally-weighted bits proportional to said input signal that are in a first sequence;
re-ordering said bits into a second sequence with a first transformation that is not dependent on said first sequence; and
re-ordering said bits in said second sequence into a third sequence with a second transformation that is dependant on said second sequence;
wherein frequency-dependent noise is shifted towards higher frequencies.

12. The method of claim 11, wherein said first transformation comprises swapping said bits using a butterfly algorithm driven by a series of pseudorandom control signals.

13. The method of claim 11, wherein said first transformation comprises rotating said bits through a number of rotations, the number of rotations determined by a pseudorandom control signal.

14. The method of claim 11, wherein converting said input signal to equally weighted bits comprises converting said bits into a thermometer code.

15. A noise-shaper system, comprising:
a first stage having an output that provides a non-random sequence of equally-weighted bits on a plurality of respective channels;
a second stage coupled to receive said first stage output, and in response to produce a random sequence of said bits on said channels; and
a third stage scrambler coupled to receive said random bit sequence, and in response produce a second output on said channels with a random long-term distribution of said bits over said channels, but a greater than random bit switching frequency per channel;
wherein said bits are noise shaped at said second output to reduce distortion.

16. The system of claim 15, wherein said first stage is a thermometer decoder.

17. The system of claim 15, wherein said second stage is a randomizer.

18. The system of claim 17, wherein said randomizer is a barrel rotator.

19. The system of claim 17, wherein the randomizer is a scrambler.

* * * * *